(12) United States Patent
Nishimura et al.

(10) Patent No.: US 7,244,978 B2
(45) Date of Patent: Jul. 17, 2007

(54) SOLID STATE IMAGING DEVICE AND METHOD FOR MANUFACTURING SOLID STATE IMAGING DEVICE

(75) Inventors: Hidetaka Nishimura, Gifu (JP); Takahiko Ogo, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 139 days.

(21) Appl. No.: 11/064,538

(22) Filed: Feb. 23, 2005

(65) Prior Publication Data

US 2005/0185080 A1  Aug. 25, 2005

(30) Foreign Application Priority Data

Feb. 24, 2004  (JP)  ............................. 2004-048254

(51) Int. Cl.
*H01L 31/062* (2006.01)

(52) U.S. Cl. ...................................... 257/291; 257/292
(58) Field of Classification Search ................ 257/291, 257/292
See application file for complete search history.

Primary Examiner—Long Pham
(74) Attorney, Agent, or Firm—Sheridan Ross P.C.

(57) ABSTRACT

A solid state imaging device and a method for manufacturing the same that prevents the reproduction characteristic of an optical image from being affected by diagonal light on a semiconductor substrate surface. A CCD image sensor includes a semiconductor substrate, light receiving pixels formed on the semiconductor substrate, and a color filter arranged above the light receiving pixels and including filters transmitting light having different wavelengths. Dummy wires, which shield light that passes through the color filter and which are electrically isolated from clock wires, are arranged at locations corresponding to boundaries of regions, each defining one of the light receiving pixels.

8 Claims, 11 Drawing Sheets

SOLID STATE IMAGING DEVICE AND METHOD FOR MANUFACTURING SOLID STATE IMAGING DEVICE

CROSS-REFERENCE TO RELATED APPLICATIONS

This application is based upon and claims the benefit of priority from the prior Japanese Patent Application No. 2004-048254, filed on Feb. 24, 2004, the entire contents of which are incorporated herein by reference.

BACKGROUND OF THE INVENTION

The present invention relates to a solid state imaging device and a method for manufacturing a solid state imaging device.

CCD image sensors are widely used as imaging devices for digital cameras and other types of equipment. For example, a frame transfer CCD image sensor is a known type of CCD image sensor.

Referring to FIG. 1, a frame transfer CCD image sensor includes an imaging section 100P for performing photoelectric conversion, a storage section 100C for temporarily storing the photoelectric-converted charges, and a horizontal transfer section 100H for supplying the charges stored in the storage section 100C to an output section 100S.

The imaging section 100P performs photoelectric conversion in correspondence with an irradiated optical image for each pixel. Information charges that are photoelectric-converted in the imaging section 100P are transferred at a high speed (frame shifted) in frame units to the storage section 100C. The information charges for one frame stored in the storage section 100C are transferred to the horizontal transfer section 100H one line at a time. The information charges stored in the horizontal transfer section 100H are sequentially transferred to the output section 100S one pixel at a time. The information charges transferred to the output section 100S are converted to a voltage value to generate an image signal of the CCD image sensor that is provided to a signal processor (not shown).

Such transfer of information charges is performed by applying voltages to each gate electrode (transfer electrode) of the CCD image sensor. More specifically, transfer clocks (drive voltages) of, for example, three different phases ($\Phi P1$ to $\Phi P3$, $\Phi C1$ to $\Phi C3$) are applied to predetermined gate electrodes of the imaging section 100P and the storage section 100C to transfer information charges. Transfer clocks (drive voltages) of, for example, two different phases ($\Phi H1$, $\Phi H2$) are applied to predetermined gate electrodes of the horizontal transfer section 100H to transfer information charges.

FIG. 2 is a plan view showing an imaging section in a CCD image sensor. As shown in FIG. 2, a plurality of gate electrodes 121 corresponding to pixels for the three primary colors of red (R), green, (G), and blue (B) are arranged on a silicon substrate 110 with a gate insulation film (not shown) applied between the silicon substrate 110 and the gate electrodes 121. An interlayer insulation film is formed on the gate electrodes 121. A plurality of clock wires 140, extending in the direction information charges are transferred from the imaging section 100P (FIG. 1) to the storage section 100C (FIG. 1), are formed on the interlayer insulation film. Each clock wire 140 is electrically connected to associated gate electrodes 121 by connection holes 141, which are arranged in the transfer direction and formed in every third gate electrode 121. The transfer clocks $\Phi P1$ to $\Phi P3$ of three difference phases are applied to the clock wires 140 so that the same voltage is applied to every third gate electrode 121 on each clock wire 140.

FIG. 3 is a schematic cross-sectional view showing the imaging section in the CCD image sensor. As shown in FIG. 3, in the CCD image sensor, p-type impurities are injected into a predetermined region of an n-type silicon substrate 110 to form a p-well 111. Further, n-type impurities are injected into predetermined regions of the p-well 111 to form a plurality of channel regions 112 associated with pixels for red (R) (not shown), green (G), and blue (B). The gate electrodes 121 are formed on a gate insulation film 120 above the silicon substrate 110.

The channel regions 112 associated with the pixels cooperate with the p-well 111 to form light receiving pixels, which receive light and perform photoelectric conversion. The information charges stored in the light receiving pixels are transferred to the storage section 100C (FIG. 1) by applying voltages to the gate electrodes 121 from the clock wires 140 via the connection holes 141 (FIG. 2).

An interlayer insulation film 122, which covers the gate electrodes 121, is formed on the silicon substrate 110. A color filter 124 for red (R) (not shown), green (G), and blue (B), which are designated in a regular manner in correspondence with the pixels, is formed on the interlayer insulation film 122. A planarizing film 125, which is, for example, acrylic, is formed on the color filter 124.

A microlens (not shown) converges the incident light of the CCD image sensor at a central portion of each channel region 112, which forms a light receiving pixel. Photoelectric conversion is performed at the central portion. Before the incident light reaches the channel regions 112, the color filter 124 first selectively transmits light corresponding to predetermined primary colors and cuts out other light. Thus, in each channel region 112, photoelectric conversion is performed in correspondence with the light of the primary color selectively transmitted in association with the color filter 124.

In such a CCD image sensor, diagonal incident light transmitted through an adjacent portion of the filter 124 may be received by a light receiving pixel that differs from the intended light receiving pixel. More specifically, referring to FIG. 3, diagonal light L1 entering, for example, a blue (B) portion of the filter 124 may be received by a light receiving pixel that corresponds to green (G). In such a case, the light receiving pixel corresponding to blue (B) should photoelectric-convert a signal. However, the light receiving pixel corresponding to green (G) adds a green component to a blue component. This mixes colors and affects the color reproduction characteristic in an undesirable manner.

In recent years, there is a tendency for the number of pixels to be increased to improve resolution in a solid state imaging device. At the same time, there is a demand for a more compact solid state imaging device. Thus, pixels are being miniaturized and laid out with higher integration. As a result, the mixing of colors due to diagonal light has become more problematic.

In addition to a frame transfer CCD image sensor, diagonal light also affects color reproduction in an undesirable manner as described above in a solid state imaging device provided with a color filter.

Further, in addition to a solid state imaging device provided with color filters, when diagonal light enters an adjacent pixel, the reproduction characteristic of an optical image is affected in an undesirable manner in a so-called monochrome CCD image sensor.

SUMMARY OF THE INVENTION

The present invention provides a solid state imaging device and a method for manufacturing a solid state imaging device that prevents the reproduction characteristic of an optical image from being affected by diagonal light on a semiconductor substrate surface.

One aspect of the present invention is a solid state imaging device including a semiconductor substrate. A plurality of light receiving pixels are formed on the semiconductor substrate to generate charges corresponding to an optical image generated through photoelectric conversion. A plurality of clock wires are arranged above the light receiving pixels to receive a transfer clock signal that transfers the charges generated by the light receiving pixels as information charges. A plurality of dummy wires are electrically separated from the clock wires and arranged above the light receiving pixels at locations corresponding to boundaries of regions, each defining one of the light receiving pixels.

Another aspect of the present invention is a method for manufacturing a solid state imaging device including a semiconductor substrate, a plurality of light receiving pixels formed on the semiconductor substrate for generating charges corresponding to an optical image generated through photoelectric conversion, and a plurality of clock wires arranged above the light receiving pixels for receiving a transfer clock signal that transfers the charges generated by the light receiving pixels as information charges. The method includes forming a wire material film above the light receiving pixels. Further, the method includes forming on the wire material film, at locations corresponding to boundaries of regions, each defining one of the light receiving pixels, a first resist pattern, corresponding to the clock wires, and a second resist pattern, physically separated from the first resist pattern. The method also includes partially removing the wire material film using the first and second resist patterns as a mask to simultaneously form the clock wires, corresponding to the first resist pattern, and a plurality of dummy wires, corresponding to the second resist pattern.

A further aspect of the present invention is a method for manufacturing a solid state imaging device including a semiconductor substrate, a plurality of light receiving pixels formed on the semiconductor substrate for generating charges corresponding to an optical image generated through photoelectric conversion, and a plurality of clock wires arranged above the light receiving pixels for receiving a transfer clock signal that transfers the charges generated by the light receiving pixels as information charges. The method includes forming an interlayer insulation film above the light receiving pixels and forming in the interlayer film, at locations corresponding to boundaries of regions, each defining one of the light receiving pixels, a plurality of first grooves, corresponding to the clock wires, a plurality of second grooves, physically separated from the first grooves, and a plurality of connection holes respectively connected to bottom portions of the first grooves. Further, the method includes forming a wire material film covering the first grooves, the second grooves, and the connection holes and partially removing the wire material film so that only wire material embedded in the first and second grooves remains to form the clock wires, respectively corresponding to the first grooves, and the dummy wires, respectively corresponding to the second grooves.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
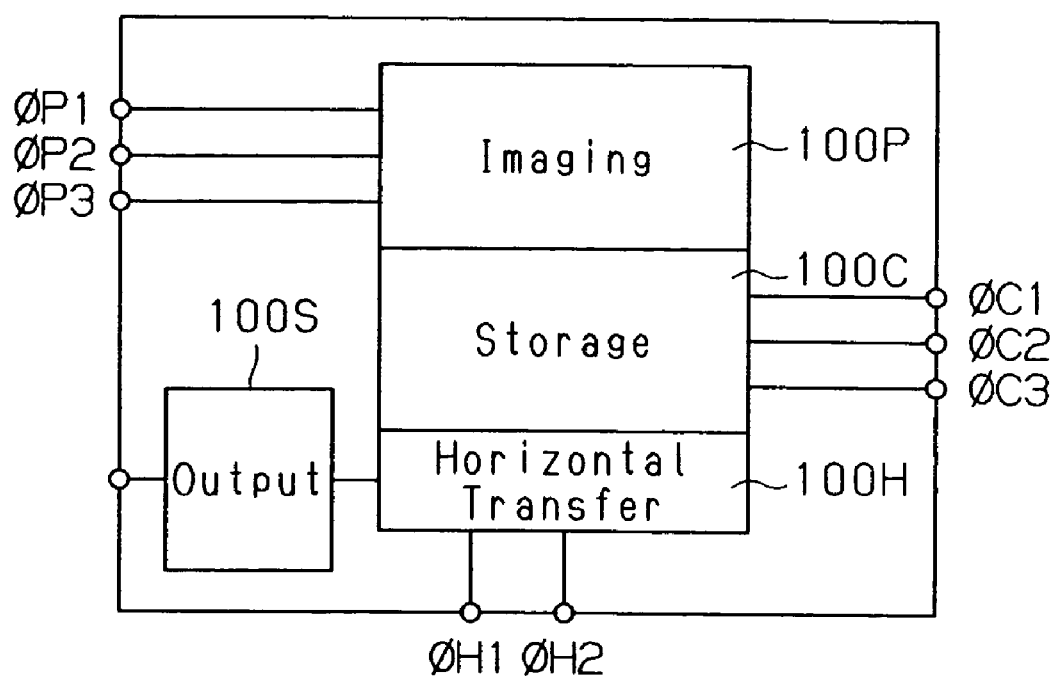
FIG. 1 is a schematic block diagram of a solid state imaging device.
Figure 2:
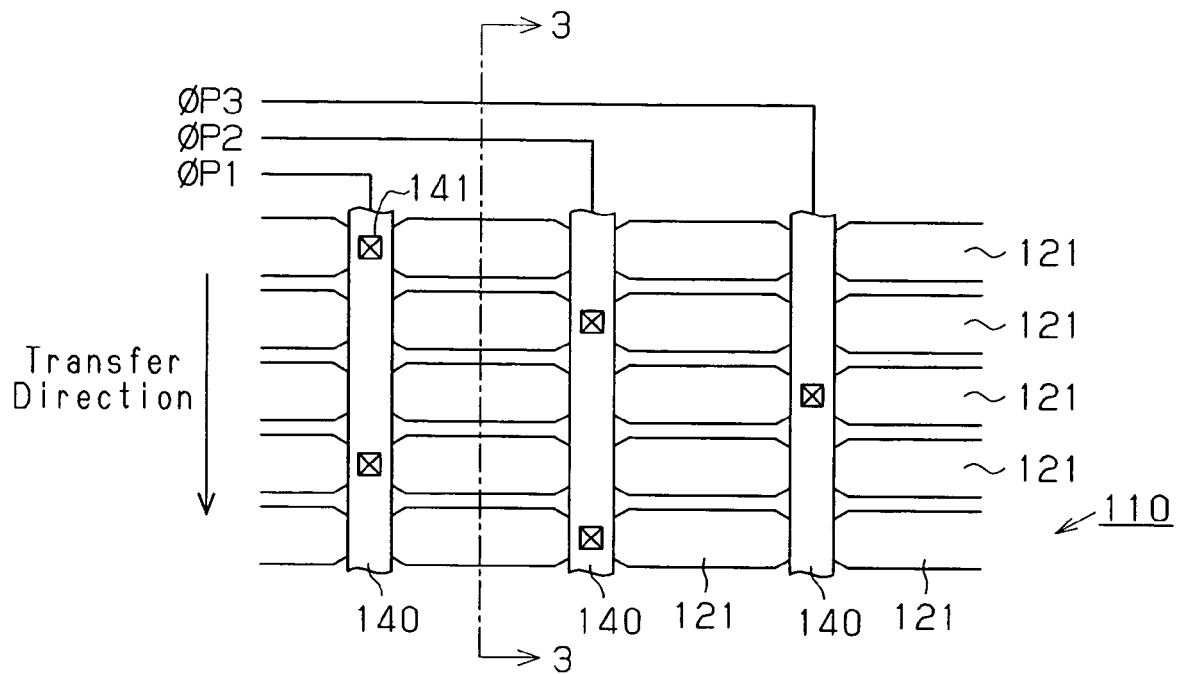
FIG. 2 is a schematic plan view of an imaging section in the solid state imaging device in the prior art.
Figure 3:
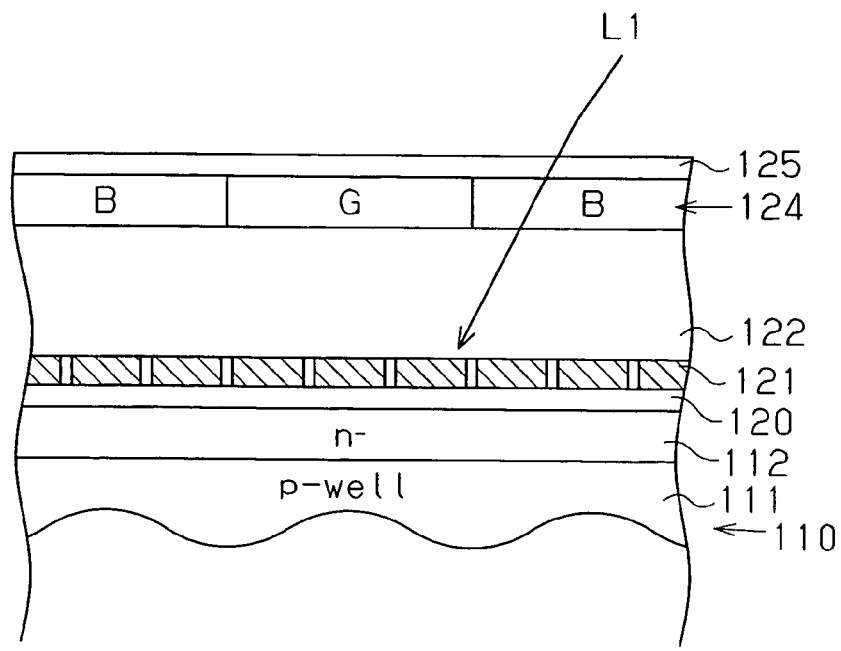
FIG. 3 is a cross-sectional view taken along line 3-3 in FIG. 2.

A frame transfer CCD image sensor, which functions as a solid state imaging device according to a first embodiment of the present invention, will now be discussed with reference to FIGS. 4 to 6. The CCD image sensor of the first embodiment is configured in the same manner as the CCD image sensor of the prior art shown in FIGS. 1 to 3 and will thus not be discussed.

Figure 4:
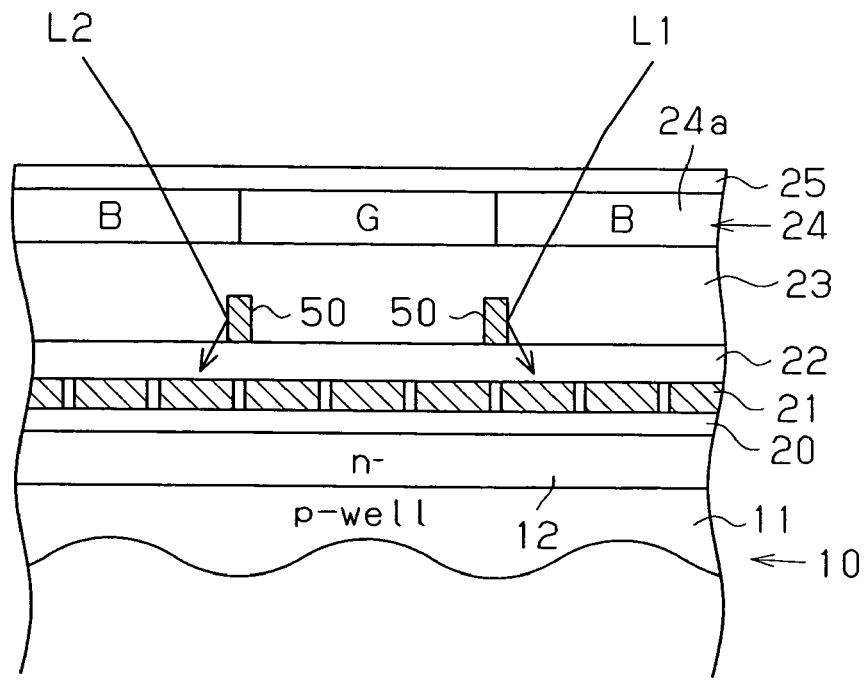
FIG. 4 is a cross-sectional view of an imaging section in a solid state imaging device according to a first embodiment of the present invention and is taken along line 4-4 in FIG. 6.
Figure 5:
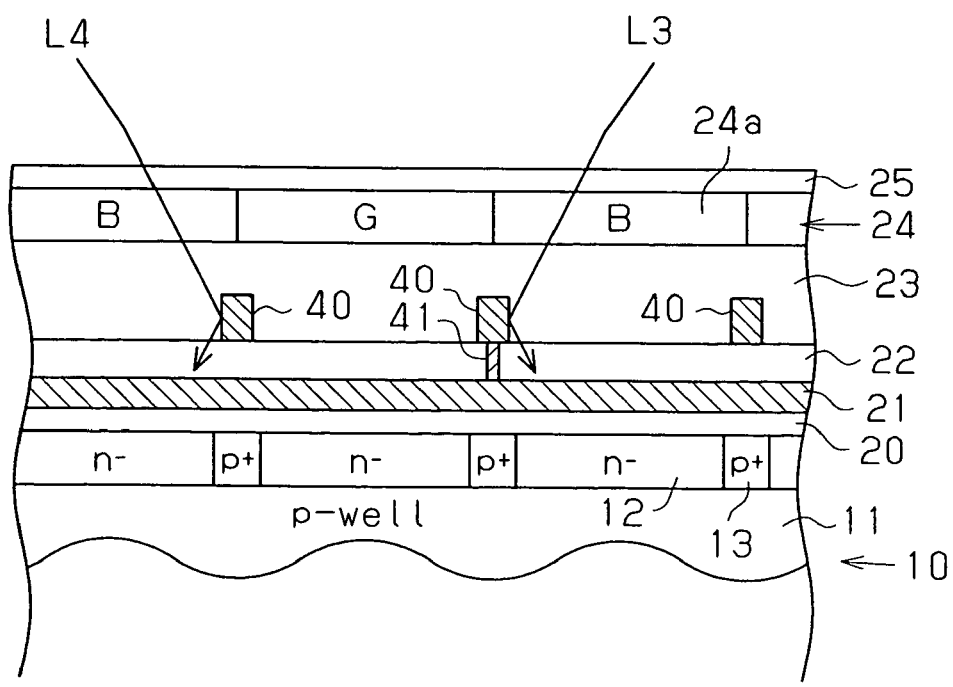
FIG. 5 is a cross-sectional view of the imaging section in the solid state imaging device of the first embodiment and is taken along line 5-5 in FIG. 6.

Referring to FIGS. 4 and 5, in the CCD image sensor of the first embodiment, p-type impurities are injected into a predetermined region of an n-type silicon substrate 10 to form a p-well 11. Further, n-type impurities are injected into predetermined regions of the p-well 11 to form a plurality of channel regions 12 associated with pixels for red (R) (not shown), green (G), and blue (B). The channel regions 12 associated with the pixels cooperate with the p-well 11 to form light receiving pixels, which receive light and perform photoelectric conversion.

A plurality of gate electrodes 21 are formed on a gate insulation film 20 above the silicon substrate 10. A first interlayer insulation film 22 (e.g., silicon oxide film), which functions as an insulation layer, is formed on the gate electrodes 21. A plurality of clock wires 40 (FIG. 5) for providing transfer clocks (drive voltage) to the gate electrodes 21 are formed on the first interlayer insulation film 22. Each clock wire 40 is electrically connected to an associated gate electrode 21 by the corresponding connection hole 41 (FIG. 5) formed in the first interlayer insulation film 22. Transfer clocks ΦP1 to ΦP3 of three different phases are sequentially applied to predetermined clock wires 40 to transfer information charges stored in each light receiving pixel from the imaging section to the storage section.

A second interlayer insulation film 23 (e.g., silicon oxide film), which functions as an insulation layer that covers the clock wires 40, is formed on the first interlayer insulation film 22. A color filter 24 is formed on the second interlayer insulation film 23. The color filter includes a plurality of filters 24a for red (R) (not shown), green (G), and blue (B) that are arranged in a regular manner in correspondence with the pixels. A planarizing film 25, which is, for example, acrylic, is formed on the color filters 24 to planarize the color filters 24.

In the first embodiment, a plurality of dummy wires 50 (FIG. 4) are formed on the first interlayer insulation film 22 and arranged in the same wiring layer as the clock wires 40. The clock wires 40 and the dummy wires 50 both have transmittance that is lower than that of each filter 24a of the color filter 24. Further, the clock wires 40 and the dummy wires 50 are both formed from material having high reflectance with respect to light (e.g., aluminum alloy). In addition to aluminum alloy, the clock wires 40 and the dummy wires 50 may be formed from, for example, titanium, tungsten, or an alloy of these materials.

Figure 6:
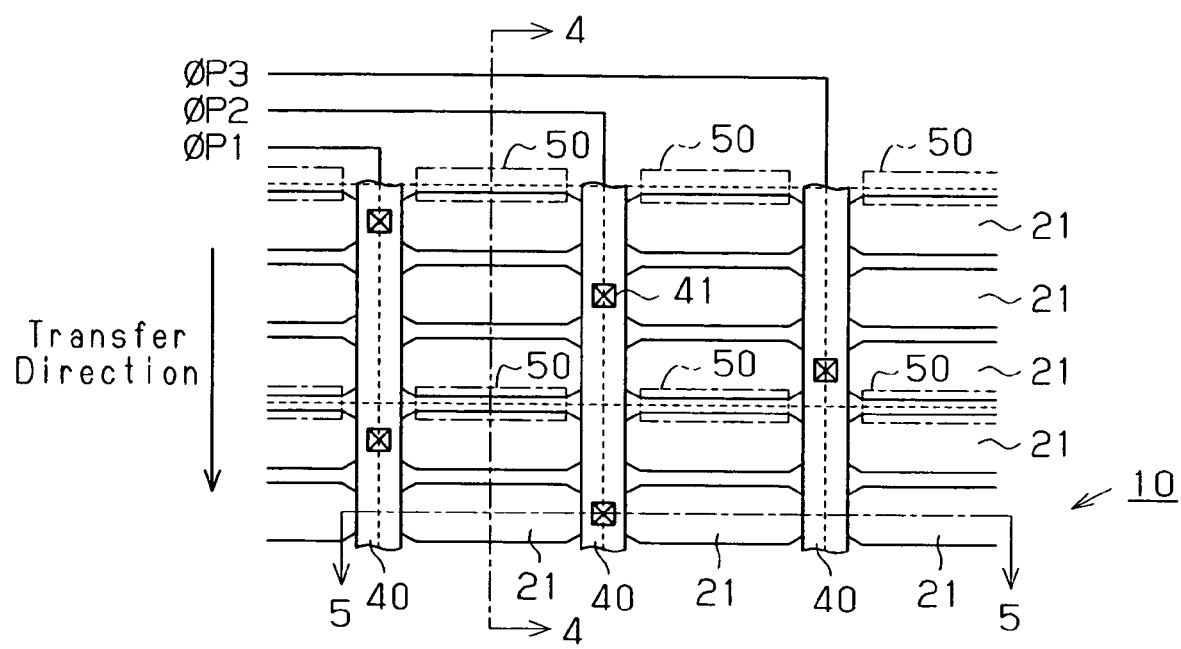
FIG. 6 is a plan view showing the imaging section in the solid state imaging device of the first embodiment.

In FIG. 6, broken lines define a plurality of regions, with each region corresponding to a light receiving pixel. Adjacent pairs of dummy wires 50 are formed between adjacent clock wires 40 and along the boundaries between the regions. That is, the dummy wires 50 surround the region of each light receiving pixel together with the clock wires 40. Further, as shown in FIG. 6, the dummy wires 50 are electrically isolated from the clock wires 40.

In the CCD image sensor of the first embodiment, diagonal incident lights L1 and L2 (FIG. 4) or incident lights L3 and L4 passing through a filter 24a that is adjacent to a certain filter are shielded by the clock wires 40 and the dummy wires 50 and thus do not enter the light receiving pixel corresponding to the certain filter. The clock wires 40 and the dummy wires 50 are formed from material having high reflectance. Thus, the clock wires 40 and the dummy wires 50 reflect diagonal incident light. The reflected diagonal lights L1 to L4 are guided to their originally intended light receiving pixels.

The procedures for manufacturing the CCD image sensor of the first embodiment will now be discussed with reference to FIGS. 7(a) to 7(d).

Figure 7A:
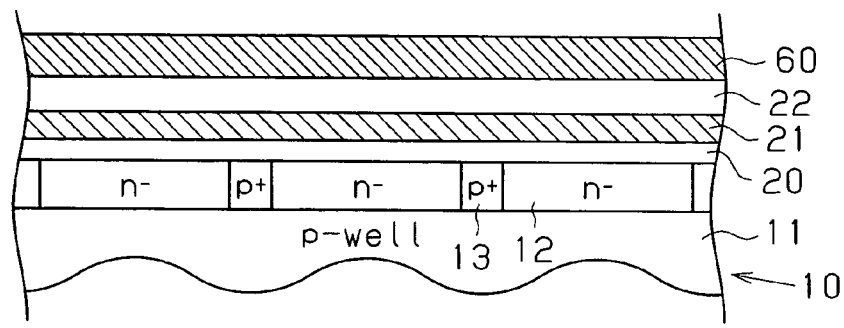
FIGS. 7(a) to 7(d) are cross-sectional views showing the procedures for manufacturing the solid state imaging device of the first embodiment.

First, referring to FIG. 7(a), the p-well 11 is formed on one main surface of the n-type semiconductor substrate 10. The channel regions 12 and the channel isolation regions 13 are formed on the surface of the p-well 11. Then the gate insulation film 20 is formed on the surface of the channel regions 12 and the channel isolation regions 13. The gate electrodes 21 are formed on the gate insulation film 20. The first interlayer insulation film 22 is formed on the gate electrodes 21. The connection holes 41 (not shown) are formed in the first interlayer insulation film 22 so as to reach the surface of the gate electrodes 21. These series of operations are performed in accordance with a known semiconductor process.

A wire material film 60 (e.g., film formed from aluminum alloy) is formed on the first interlayer insulation film 22, which includes the connection holes 41, by performing, for example, vapor deposition or sputtering. The wire material film 60 is used to form the clock wires 40 and the dummy wires 50.

Figure 7B:
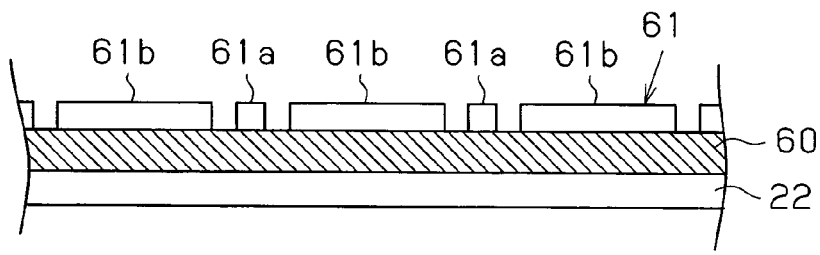

Then, referring to FIG. 7(b), resist 61 is applied to the first interlayer insulation film 22 and photolithography, which is known in the art, is performed. This forms first resist patterns 61a, which correspond to the clock wires 40, and second resist patterns 61b, which correspond to the dummy wires 50. The second resist patterns 61b are physically separated from the first resist patterns 61a.

Figure 7C:
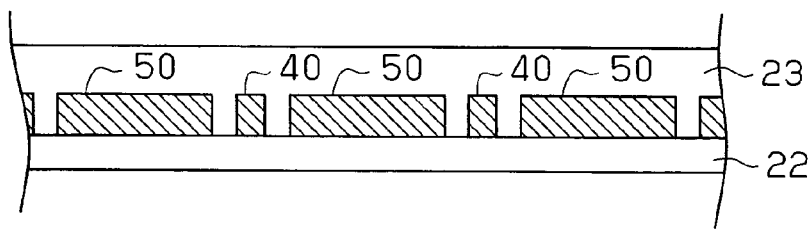

Subsequently, referring to FIG. 7(c), the wire material film 60 is etched using the first and second resist patterns 61a and 61b, which were formed in the preceding operation, as a mask. This simultaneously forms the clock wires 40 and the dummy wires 50. The second interlayer insulation film 23 is then formed on the first interlayer insulation film 22 to cover the clock wires 40 and the dummy wires 50 together with the first interlayer insulation film 22.

Figure 7D:
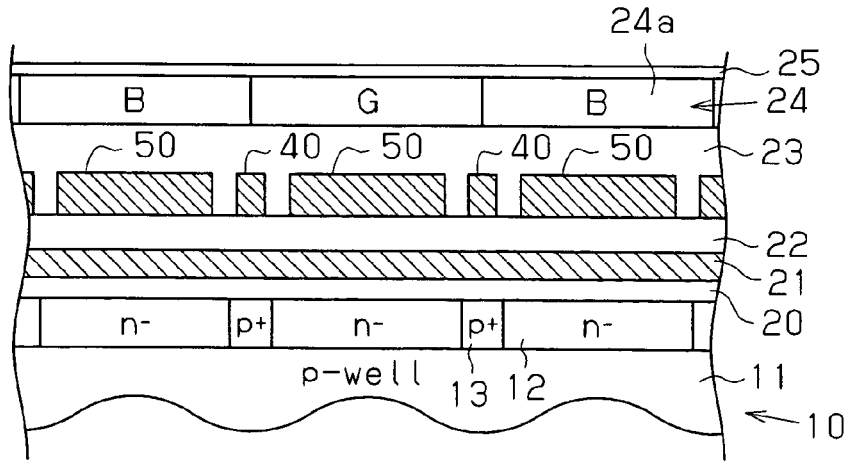

Referring to FIG. 7(d), a planarizing process is performed on the second interlayer insulation film 23 through, for example, chemical mechanical polishing (CMP) or an etch back process. Afterward, the color filter 24 is formed in correspondence with the light receiving pixels. Further, the planarizing film 25, which is, for example, acrylic, and the microlens (not shown) are arranged on the color filter 24. In this manner, the CCD image sensor is manufactured.

The CCD image sensor of the first embodiment has the advantages described below.

(1) The dummy wires 50, which are electrically isolated from the clock wires 40, are formed along the boundaries between light receiving pixels. Thus, the clock wires 40 and the dummy wires 50 form light shield walls that surround each light receiving pixel. Accordingly, the clock wires 40 and the dummy wires 50 prevent diagonal incident light from entering non-intended light receiving pixels. This prevents the mixing of colors in an optimal manner.

(2) The clock wires 40 and the dummy wires 50 are formed to be arranged in the same wiring layer. This enables the clock wires 40 and the dummy wires 50 to be formed simultaneously in the same operation. Since an operation for independently forming only the dummy wires 50 is not necessary, the number of manufacturing operations does not have to be increased.

(3) The clock wires 40 and the dummy wires 50 are formed from material having transmittance that is lower than each filter 24a of the color filter 24. This ensures a sufficient light shield characteristic.

(4) The clock wires 40 and the dummy wires 50 are formed from material having high reflectance. Thus, the clock wires 40 and the dummy wires 50 reflect diagonal incident light, which may cause color mixing, so that the light is guided to the intended light receiving pixel. This prevents the quantity of light from decreasing and improves the light convergence characteristic of the CCD image sensor.

The first embodiment may be modified in the following manner.

In the first embodiment, the dummy wires 50 are formed so that they are arranged in the same wire layer as the clock wires 40. However, the dummy wires 50 may be formed in a wire layer differing from that of the clock wires 40. This would increase the number of manufacturing operations but suppress diagonal incident light in an optimal manner.

A frame transfer CCD image sensor, which functions as a solid state imaging device according to a second embodiment of the present invention, will now be described with reference to FIGS. 8 and 9. To avoid redundancy, like or same reference numerals are given to those components that are the same as the corresponding components of the first embodiments. The description will center on parts differing from the first embodiment.

Figure 8:
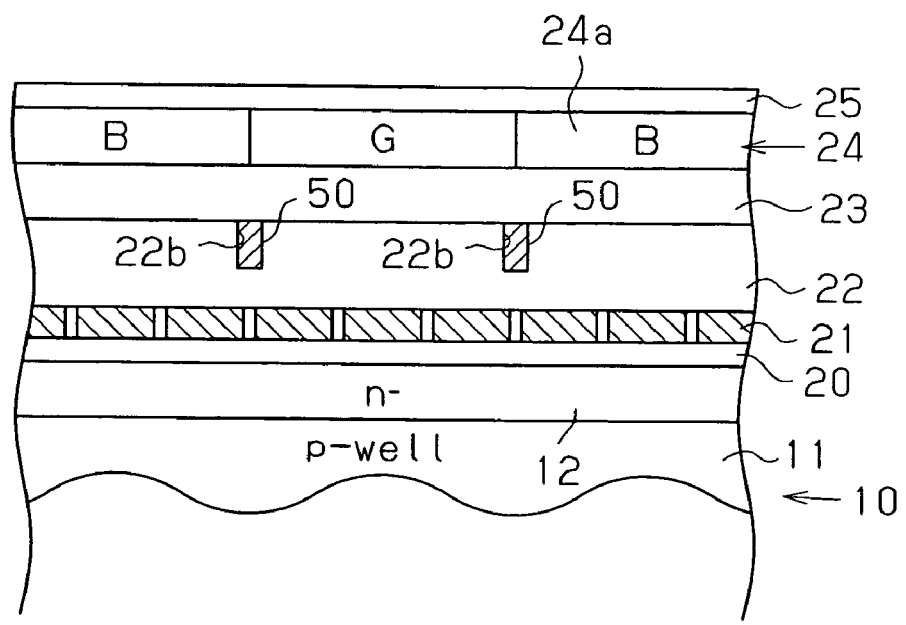
FIG. 8 is a cross-sectional view of an imaging section in a solid state imaging device according to a second embodiment of the present invention and corresponds to a view taken along line 4-4 in FIG. 6.
Figure 9:
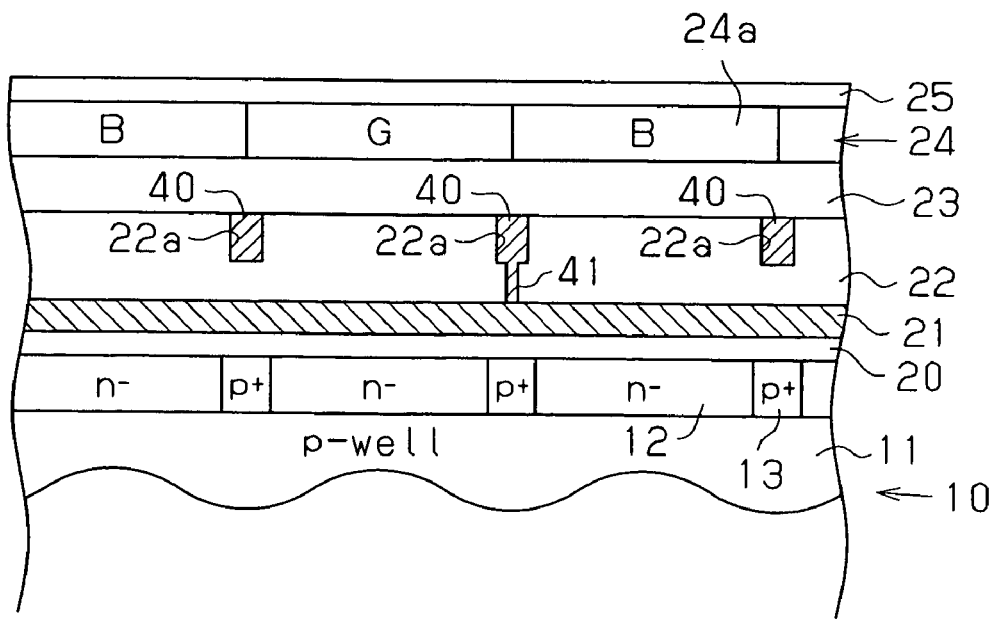
FIG. 9 is a cross-sectional view of the imaging section in the solid state imaging device of the second embodiment and corresponds to a view taken along line 5-5 in FIG. 6.
Figure 10A:
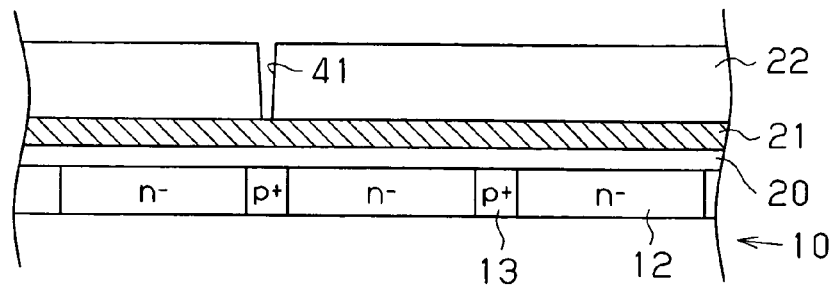
FIGS. 10(a) to 10(e) are cross-sectional views showing the procedures for manufacturing the solid state imaging device of the second embodiment.
Figure 10B:
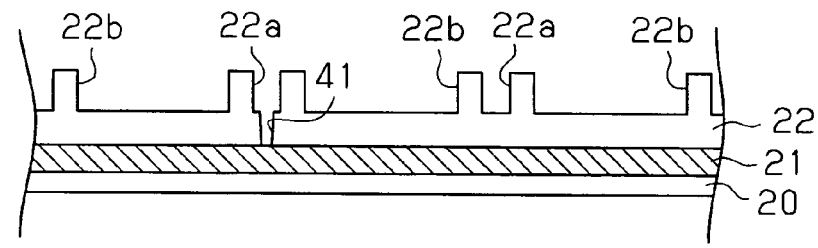
Figure 10C:
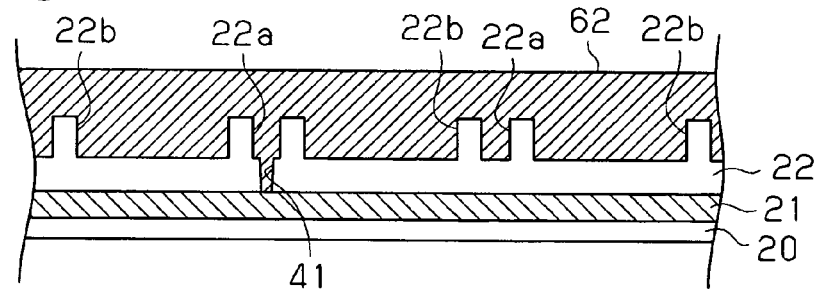
Figure 10D:
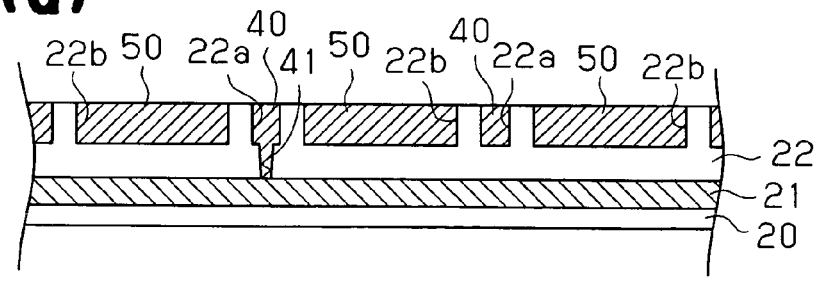
Figure 10E:
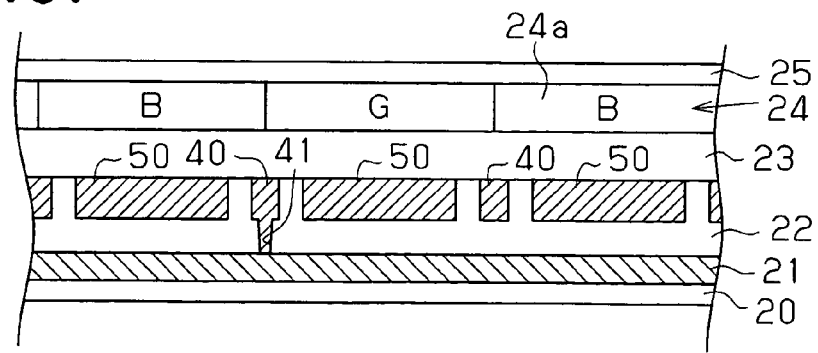

FIGS. 8 and 9 are cross-sectional views of an imaging section in the second embodiment and correspond to FIGS. 4 and 5. As shown in FIGS. 8 and 9, in the CCD image sensor of the second embodiment, the clock wires 40 and the dummy wires 50 are respectively embedded in grooves 22*a* and grooves 22*b* formed in the first interlayer insulation film 22. The second interlayer insulation film 23 is superimposed on the first interlayer insulation film 22, in which the clock wires 40 and the dummy wires 50 are embedded.

A method for manufacturing the CCD image sensor of the second embodiment will now be discussed with reference to FIG. 10. In the second embodiment, the CCD image sensor is manufactured by forming the clock wires 40, the connection holes 41, and the dummy wires 50 in an embedding process, that is, by employing the so-called dual Damascene process. The following description will be given under the assumption that operations up to the formation of the gate electrodes 21 have been performed in accordance with a known semiconductor manufacturing process in the same manner as in the first embodiment.

Referring to FIG. 10(*a*), the first interlayer insulation film 22 is formed on the gate electrodes 21 by performing, for example, chemical vapor deposition (CVD). Then, resist (not shown) is applied to the first interlayer insulation film 22. Photolithography, which is known in the art, is performed to partially remove the resist and form openings corresponding to the connection holes 41. Then, etching, such as dry etching, is performed using the resist as a mask. As shown in FIG. 10(*a*), this forms the connection holes 41, which extend through the first interlayer insulation film 22 and reaches the gate electrodes 21.

Subsequently, referring to FIG. 10(*b*), after the etching, for example, dry etching is performed on the first interlayer insulation film 22 to form the grooves 22*a*, corresponding to the clock wires 40 above the connection holes 41, and the grooves 22*b*, corresponding to the dummy wires 50 and physically separated from the grooves 22*a*.

Referring to FIG. 10(*c*), a wire material film 62 (e.g., film formed from aluminum alloy) is formed on the surface of the first interlayer insulation film 22, which includes the walls of the connection holes 41 and the grooves 22*a* and 22*b*, by performing, for example, vapor deposition or sputtering. Then, referring to FIG. 10(*d*), a polishing process (planarizing process) is performed on the wire material film 62 through, for example, chemical mechanical polishing (CMP). This partially removes the wire material film 62 and exposes the first interlayer insulation film 22. As a result, the clock wires 40 and the dummy wires 50 are simultaneously formed embedded in the grooves 22*a* and 22*b*.

Then, referring to FIG. 10(*e*), the second interlayer insulation film 23 is formed on the first interlayer insulation film 22, in which the clock wires 40 and the dummy wires 50 are formed, by performing, for example, plasma chemical vapor deposition (CVD). After performing a planarizing process on the second interlayer insulation film 23 through, for example, CMP, the color filter 24 is formed in correspondence with the light receiving pixels on the second interlayer insulation film 23. Further, the planarizing film 25, which is, for example, acrylic, and the microlens (not shown) are arranged on the color filter 24. In this manner, the CCD image sensor of the second embodiment is manufactured.

In addition to advantages (1) to (4) of the first embodiment, the CCD image sensor of the second embodiment has advantage (5) as described below.

(5) The connection holes 41 and the grooves 22*a* and 22*b* are formed in the first interlayer insulation film 22. The clock wires 40 and the dummy wires 50 are respectively embedded in the grooves 22*a* and 22*b*. Thus, in comparison with the first embodiment in which the dummy wires are formed through an etching operation, the formation of dummy wires 50 that are finer and have higher walls is enabled. This prevents the light receiving regions from being narrowed and prevents the quantity of light from being decreased by the dummy wires 50.

The CCD image sensor of the second embodiment may be modified as described below.

In the second embodiment, the dummy wires 50 are formed so that they are arranged in the same wire layer as the clock wires 40. However, the dummy wires 50 may be formed in a wire layer differing from that of the clock wires 40. For example, the dummy wires 50 may be embedded in the second interlayer insulation film 23. This would increase the number of manufacturing operations but suppress diagonal incident light in an optimal manner.

A frame transfer CCD image sensor, which functions as a solid state imaging device according to a third embodiment of the present invention, will now be described with reference to FIGS. 11 to 13. To avoid redundancy, like or same reference numerals are given to those components that are the same as the corresponding components of the first and second embodiments. The description will center on parts differing from the first and second embodiments.

Figure 11:
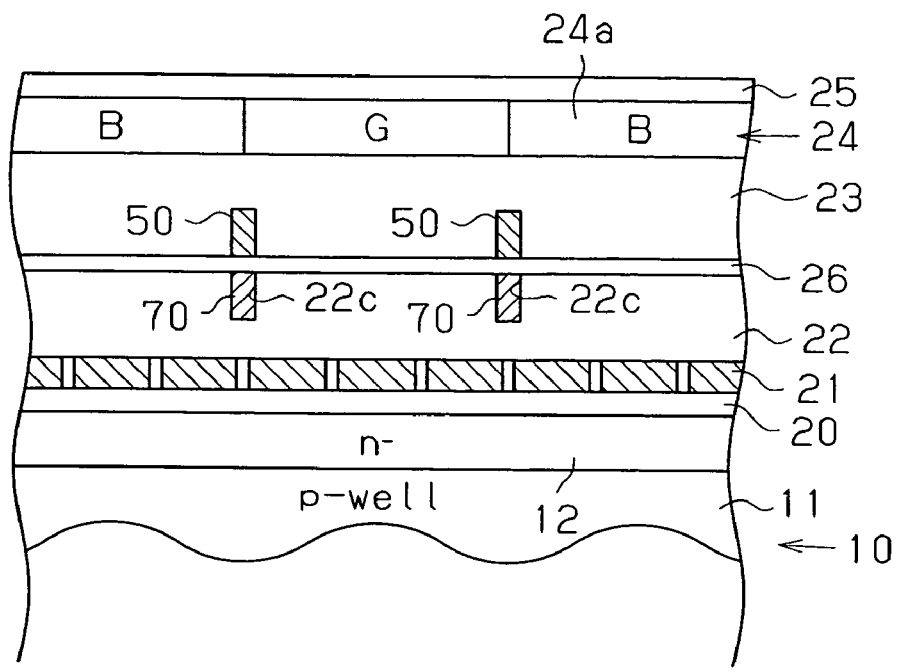
FIG. 11 is a cross-sectional view of an imaging section in a solid state imaging device according to a third embodiment of the present invention and corresponds to a view taken along line 4-4 in FIG. 6.
Figure 12:
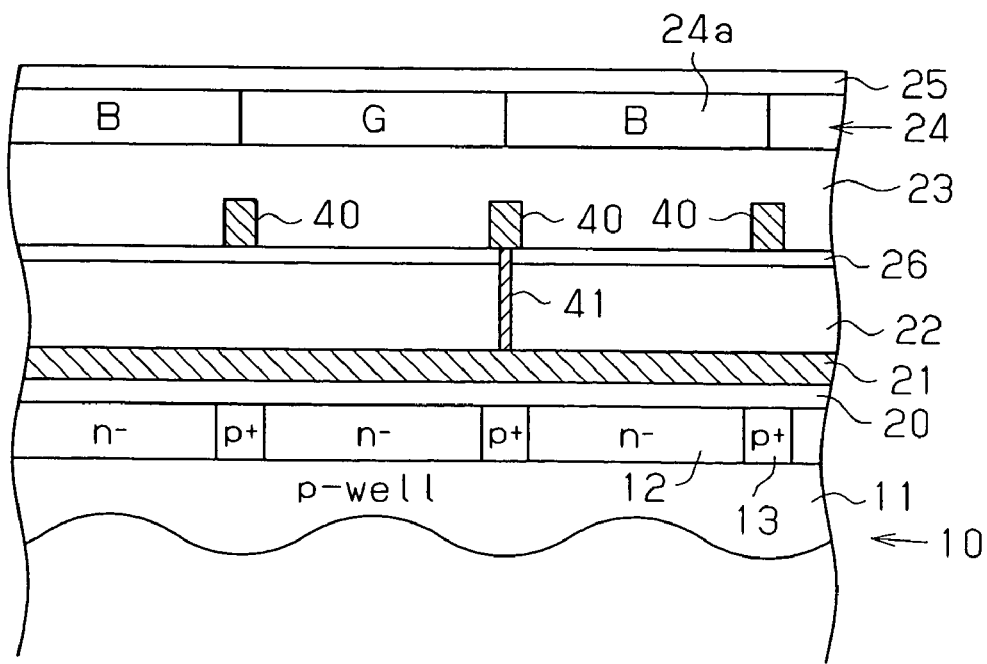
FIG. 12 is a cross-sectional view of the imaging section in the solid state imaging device of the third embodiment and corresponds to a view taken along line 5-5 in FIG. 6.
Figure 13:
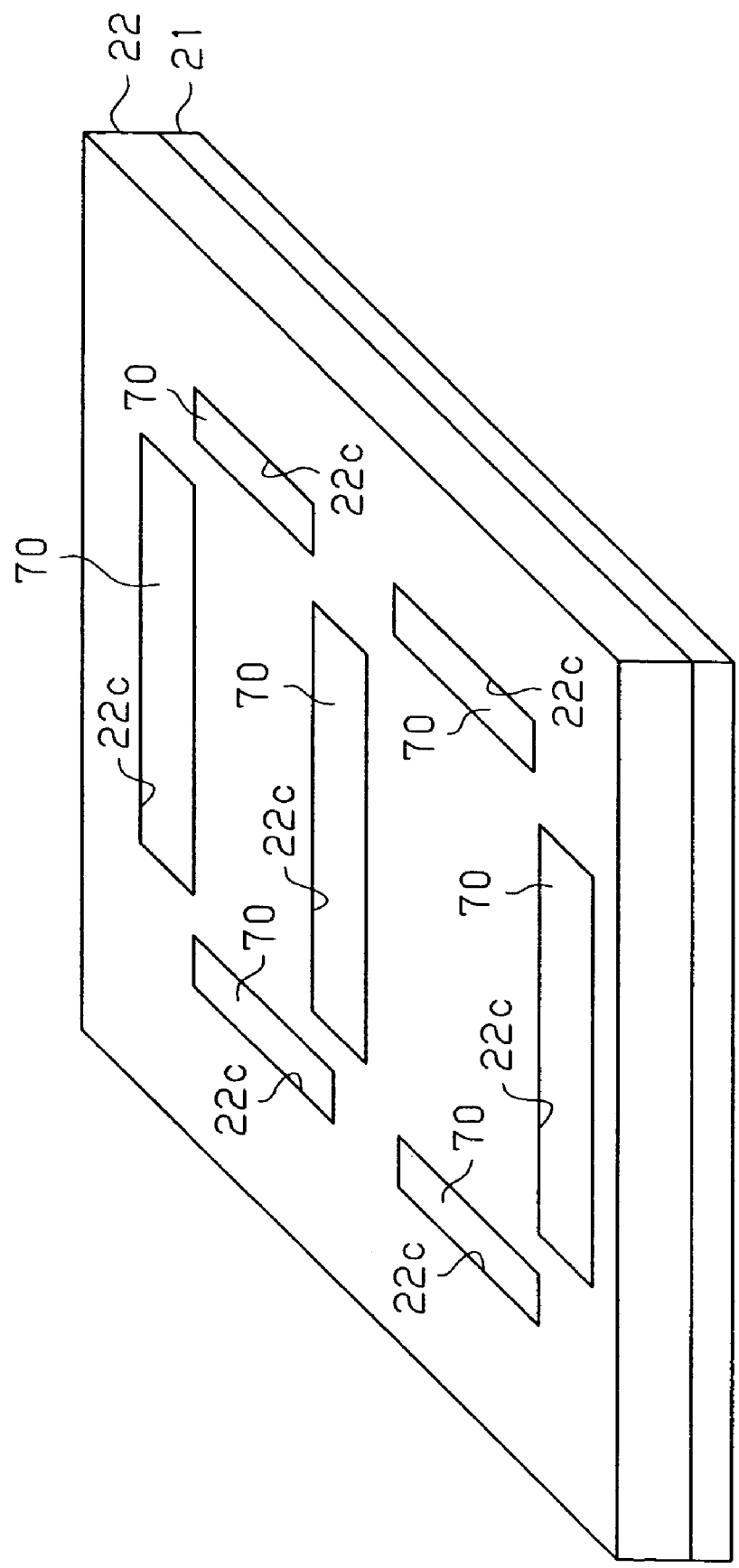
FIG. 13 is a schematic perspective view showing light shield walls of the imaging section in the solid state imaging device of the third embodiment.

FIG. 11 and 12 are cross-sectional views of an imaging section in the third embodiment and correspond to FIGS. 4 and 5.

As shown in FIGS. 11 and 12, in the CCD image sensor of the third embodiment, the clock wires 40 and the dummy wires 50 are arranged in the same wire layer and covered by the second interlayer insulation film 23. Further, light shield walls 70 are arranged adjacent to the wire layer, in which the clock wires 40 and the dummy wires 50 are formed, via an underlayer insulation film 26. The light shield walls 70, which are embedded in grooves 22*c* that are formed in the first interlayer insulation film 22, are formed in correspondence with the clock wires 40 and the dummy wires 50 (refer to FIG. 13). That is, the light shield walls 70 are arranged to surround each light receiving pixel region. The clock wires 40 are electrically connected to the gate electrodes 21 by connection holes 41 (FIG. 12) extending through the underlayer insulation film 26 and the first interlayer insulation film 22.

A method for manufacturing the CCD image sensor of the third embodiment will now be discussed with reference to FIGS. 14(*a*) to 14(*e*). In the second embodiment, the CCD image sensor is manufactured by forming the light shield walls 70 in an embedding process, that is, by employing the so-called Damascene process. The following description will be given under the assumption that operations up to the formation of the gate electrodes 21 have been performed in accordance with a known semiconductor manufacturing process in the same manner as in the first embodiment.

Figure 14A:
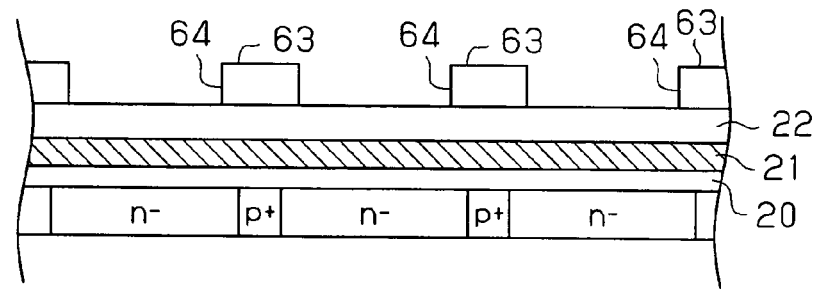
FIGS. 14(a) to 14(e) are cross-sectional views showing the procedures for manufacturing the solid state imaging device of the third embodiment.

Referring to FIG. 14(a), the first interlayer insulation film 22 is formed on the gate electrodes 21. Then, resist 63 is applied to the first interlayer insulation film 22. Photolithography, which is known in the art, is performed to partially remove the resist 63 and form openings 64 corresponding to the light shield walls 70. Then, etching is performed using the resist 63, in which the openings 64 are formed, as a mask to partially remove the first interlayer insulation film 22 and form the grooves 22c.

Figure 14B:
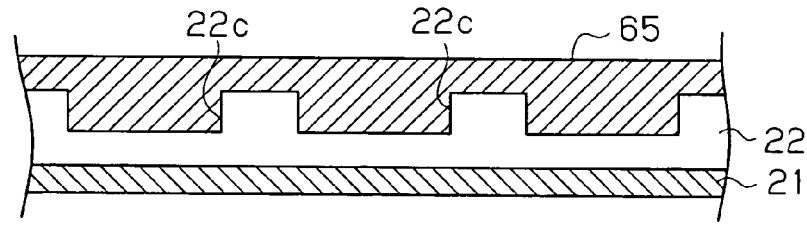

Subsequently, referring to FIG. 14(b), a light shield material film 65 (e.g., film formed from aluminum alloy) is formed on the surface of the first interlayer insulation film 22, which includes the walls of the 22c, by performing, for example, vapor deposition or sputtering.

Figure 14C:
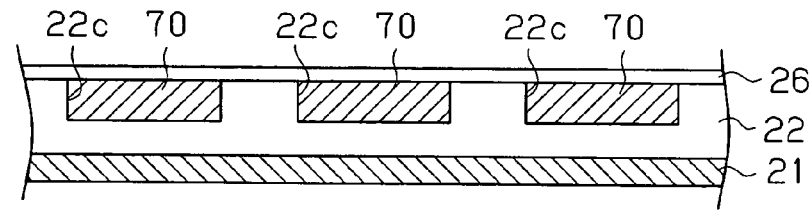

Then, referring to FIG. 14(c), a polishing process (planarizing process) is performed on the light shield material film 65, which has been formed in the preceding operation, through, for example, chemical mechanical polishing (CMP). This partially removes the light shield material film 65 so that only the light shield material embedded in the grooves 22c remains to form the light shield walls 70 in the grooves 22c. Then, the underlayer insulation film 26 is formed on the light shield walls 70 and the first interlayer insulation film 22.

Figure 14D:
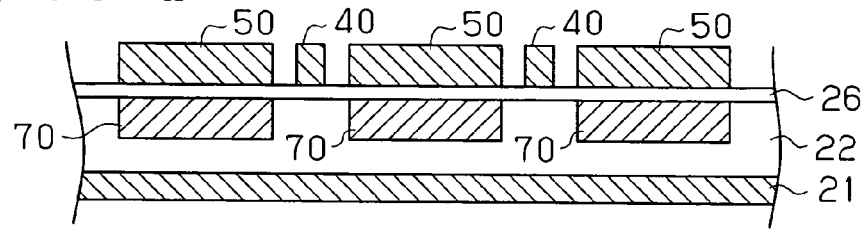

Subsequently, referring to FIG. 14(d), the connection holes 41 (not shown) are formed extending through the underlayer insulation film 26 and the first interlayer insulation film 22 to the gate electrodes 21. The connection holes 41 must be formed at locations that do not interfere with the light shield walls 70. Then, the clock wires 40 and the dummy wires 50 are formed through the same process as the first embodiment. More specifically, a wire material film (e.g., film formed from aluminum alloy) is formed on the underlayer insulation film 26. Then, a resist is applied to the wire material film and, for example, photolithography is performed to form patterns corresponding to the clock wires 40 and the dummy wires 50. Afterwards, for example, etching is performed, using the resist as a mask, to form the clock wires 40 and the dummy wires 50 on the underlayer insulation film 26.

Figure 14E:
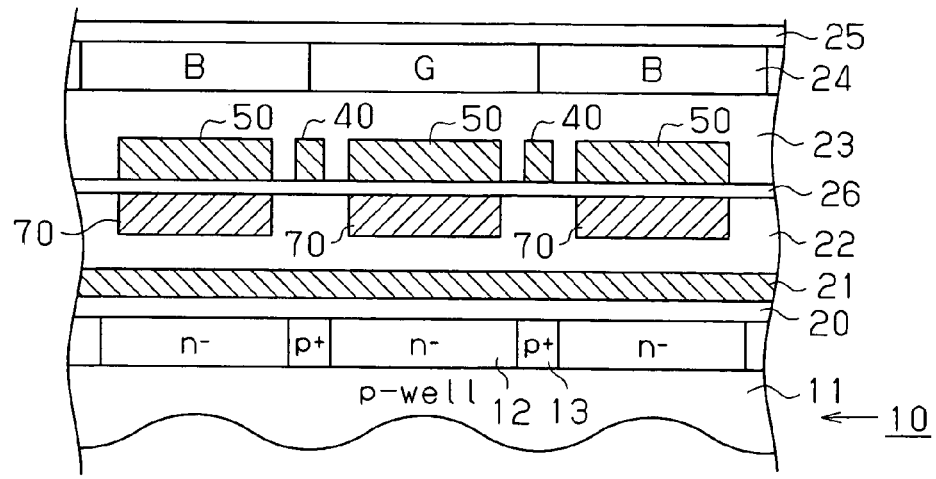

Then, referring to FIG. 14(e), the second interlayer insulation film 23, which covers the clock wires 40 and the dummy wires 50, is formed on the underlayer insulation film 26 by performing, for example, plasma chemical vapor deposition (CVD). After performing a planarizing process on the second interlayer insulation film 23 through, for example, CMP, the color filter 24 is formed in correspondence with the light receiving pixels on the second interlayer insulation film 23. Further, the planarizing film 25, which is, for example, acrylic, and the microlens (not shown) are arranged on the color filter 24. In this manner, the CCD image sensor is manufactured.

In addition to advantages (1) to (4) of the first embodiment and advantage (5) of the second embodiment, the CCD image sensor of the third embodiment has advantages (6) and (7) as described below.

(6) The light shield walls 70, which correspond to the clock wires 40 and the dummy wires 50, are arranged adjacent to the wire layer in which the clock wires 40 and the dummy wires 50 are formed. This increases the light shield capability and obtains an optimal light shield effect with respect to diagonal incident light.

(7) The light shield walls 70 are formed so that they are arranged in a layer differing from that of the clock wires 40. Thus, the formation of the light shield walls 70 is not restricted by the location of the clock wires 40. This increases the freedom of design for the light shield walls 70. Accordingly, the light shield walls 70 may be formed to surround the light receiving pixels. This effectively shields diagonal incident light.

It should be apparent to those skilled in the art that the present invention may be embodied in many other specific forms without departing from the spirit or scope of the invention. Particularly, it should be understood that the present invention may be embodied in the following forms.

The number of layers in which the light shield walls 70 are arranged and the locations of the light shield walls 70 are not restricted. For example, light shield walls may be formed in a layer closer to the color filter 24 than the wire layer.

Figure 15:
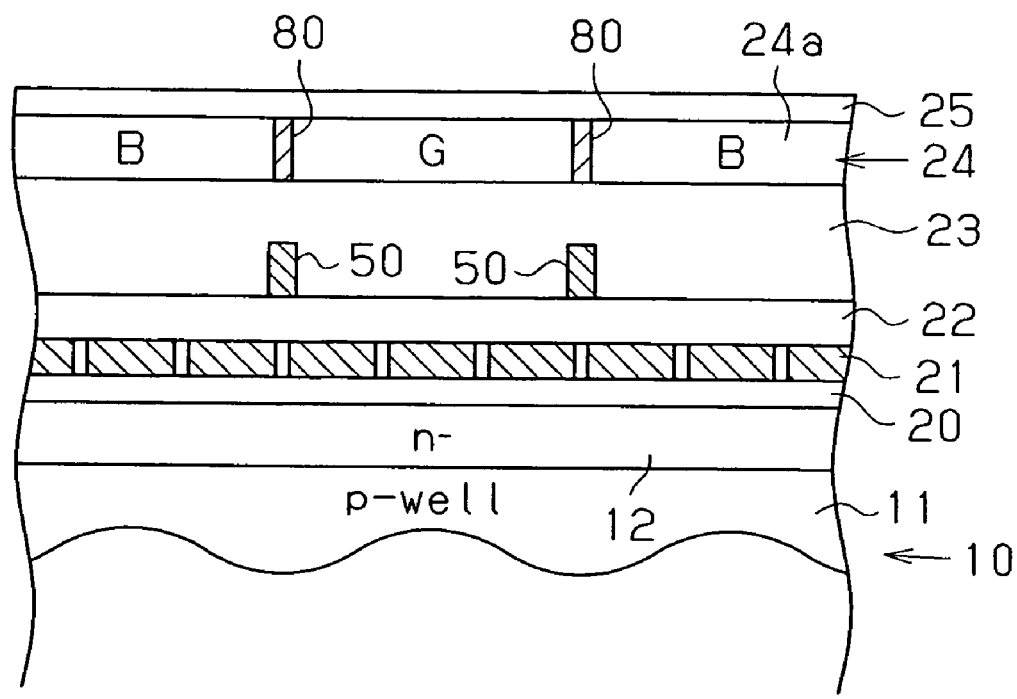
FIG. 15 is a cross-sectional view of an imaging section in a solid state imaging device according to another embodiment of the present invention.

Referring to FIG. 15, in the cross-sectional configuration of the first embodiment, light shield walls 80 may be formed in boundary portions of the color filter 24. In such a case, the clock wires 40 and the dummy wires 50 cooperate with the light shield walls 80 to optimally shield diagonal incident light.

The clock wires 40 and the dummy wires 50 may be formed from other materials. For example, the clock wires 40 and the dummy wires 50 may be formed from material having a light absorption property, such as black carbon.

The present invention may be applied to a monochrome CCD image sensor. In this case, the clock wires 40 and the dummy wires 50 also shield diagonal incident light. This prevents the reproduction characteristic of optical images from deteriorating.

In addition to a frame transfer CCD image sensor, the present invention may be applied to other CCD image sensors, such as an interline transfer CCD image sensor. Further, in addition to a CCD image sensor, the present invention may be applied to a solid state imaging device, such as a CMOS image sensor.

The present examples and embodiments are to be considered as illustrative and not restrictive, and the invention is not to be limited to the details given herein, but may be modified within the scope and equivalence of the appended claims.

What is claimed is:

1. A solid state imaging device comprising;
   a semiconductor substrate;
   a plurality of light receiving pixels, formed on the semiconductor substrate, for generating charges corresponding to an optical image generated through photoelectric conversion;
   a plurality of clock wires, arranged above the light receiving pixels, for receiving a transfer clock signal that transfers the charges generated by the light receiving pixels as information charges; and
   a plurality of dummy wires electrically isolated from the clock wires and arranged above the light receiving pixels at locations corresponding to boundaries of regions, each defining one of the light receiving pixels, wherein each of the plurality of dummy wires is arranged along a direction that is different from the direction where each of the plurality of clock wires is arranged.

2. The solid state imaging device according to claim 1, further comprising:
   an insulation layer arranged above the light receiving pixels together with the clock wires and the dummy wires.

3. The solid state imaging device according to claim 1, further comprising:

a color filter arranged on the insulation layer and including a plurality of filters respectively corresponding to the light receiving pixels, the filters each transmitting light having a different wavelength.

4. The solid state imaging device according to claim 1, wherein the clock wires and the dummy wires are arranged in the same wire layer.

5. The solid state imaging device according to claim 4, further comprising:

a plurality of light shield walls respectively arranged in correspondence with the clock wires and the dummy wires in a layer differing from the wire layer.

6. The solid state imaging device according to claim 4, wherein each of the clock wires and each of the dummy wires are each arranged to surround the region.

7. A solid state imaging device comprising;

a semiconductor substrate;

a plurality of light receiving pixels, formed on the semiconductor substrate, for generating charges corresponding to an optical image generated through photoelectric conversion;

a plurality of clock wires, arranged above the light receiving pixels, for receiving a transfer clock signal that transfers the charges generated by the light receiving pixels as information charges;

a plurality of dummy wires electrically isolated from the clock wires and arranged above the light receiving pixels at locations corresponding to boundaries of regions, each defining one of the light receiving pixels; and a plurality of light shield walls respectively arranged in correspondence with the clock wires and the dummy wires in a layer differing from the wire layer.

8. A solid state imaging device comprising;

a semiconductor substrate;

a plurality of light receiving pixels, formed on the semiconductor substrate, for generating charges corresponding to an optical image generated through photoelectric conversion;

a plurality of clock wires, arranged above the light receiving pixels, for receiving a transfer clock signal that transfers the charges generated by the light receiving pixels as information charges; and a plurality of dummy wires electrically isolated from the clock wires and arranged above the light receiving pixels at locations corresponding to boundaries of regions, each defining one of the light receiving pixels;

wherein each of the clock wires and each of the dummy wires are each arranged to surround the region.

* * * * *